(12) United States Patent
Jackel

(10) Patent No.: US 6,515,796 B2
(45) Date of Patent: Feb. 4, 2003

(54) SATURATED AMPLIFIER GENERATING BURST SUPPORT SIGNAL

(75) Inventor: Janet Jackel, Holmdel, NJ (US)

(73) Assignee: Telcordia Technologies, Inc., Morristown, NJ (US)

( * ) Notice: Subject to any disclaimer, the term of this patent is extended or adjusted under 35 U.S.C. 154(b) by 85 days.

(21) Appl. No.: 09/812,324

(22) Filed: Mar. 20, 2001

(65) Prior Publication Data

US 2002/0135867 A1 Sep. 26, 2002

(51) Int. Cl.[7] .............................. H01S 3/16; H01S 3/083; H01S 5/00
(52) U.S. Cl. ............. 359/344; 359/337.11; 359/341.32; 359/341.4; 359/341.43
(58) Field of Search ........................ 372/43–50, 94; 359/344, 341.4, 341.44, 341.43

(56) References Cited

U.S. PATENT DOCUMENTS 5,510,926 A * 4/1996 Bayart et al. .............. 359/124
6,008,932 A * 12/1999 Luo et al. .................. 359/337
6,169,619 B1 * 1/2001 Ide ........................ 250/214 AG
6,175,436 B1 * 1/2001 Jackel ....................... 359/124

OTHER PUBLICATIONS

Tiemeijer et al. IEEE Phot. Tech. Letts. vol. 7, No. 3, Mar. 1995.*
Jackel et al. ECOC Jan. 2000.*
Mahdi et al. IEEE Phot. Tech. Letts. vol.7, No. 1 Jan./Feb. 2001.*
J. Jackel, et al, "Burst Optical Packet Transport Over the Monet DC Network", IEEE J. Lightwave Technol., Sep. 2000.

* cited by examiner

Primary Examiner—Thomas H. Tarcza
Assistant Examiner—Stephen Cunningham
(74) Attorney, Agent, or Firm—David A. Hey

(57) ABSTRACT

Circuitry and a concomitant methodology for generating a burst support signal to augment an input bursty optical signal in an optical channel. The burst support signal is produced whenever the input bursty optical signal falls below a predetermined threshold. The burst support signal is the result of self-oscillation of a semiconductor optical amplifier and a tunable optical feedback loop. The wavelength of the self-oscillation is determined by the operating characteristic of the feedback loop.

23 Claims, 9 Drawing Sheets

SATURATED AMPLIFIER GENERATING BURST SUPPORT SIGNAL

BACKGROUND OF THE DISCLOSURE

1. Field of the Invention

This invention relates generally to optical communication networks, and, more particularly, to circuitry and concomitant methodologies for mitigating transient effects in the networks caused by bursty optical signals.

2. Description of the Background

Commercial-type optical networks, and even exploratory optical networks, have conventionally been designed for optical communication presuming more traditional optical streams, that is, continuous optical streams that are amplitude modulated. Accordingly, optical power is always present in the optical streams.

There is presently substantial interest in extending the utility of the aforementioned networks beyond the traditional approach to optical burst packet transmission and even to optical packet switching. However, optical networks are often intolerant of bursty optical signals and may exhibit rapid time-dependent gain variations which impair transmission of the bursty optical signals. This intolerance arises primarily because of the operating characteristics of certain components deployed in the traditional systems (e.g., Erbium-Doped Fiber Amplifiers (EDFAs)), so that bursty input power resulting from a bursty optical signal (that is, the optical signal is a pulse-type signal with ON and OFF intervals) on one of the channels in the optical network leads to degradation of the bursty data on the given channel and of data (bursty or continuous) on other channels conveyed by the optical network.

As alluded to, EDFA's are utilized in optical networks to provide gain for propagating optical signals. An EDFA is usually stabilized to improve performance, with two techniques typically used, namely: all-optical gain clamping with a response time of tens of microseconds, and pump-power regulation. There are necessary compromises between the available gain, gain stability, noise figure, dynamic range, and response time in arriving at a suitable EDFA design for network deployment. Rapid changes in optical power can disturb EDFA gain resulting in unwanted modulation of the bursty optical signal as well as other signals simultaneously traversing a given EDFA.

Qualitatively, when an optical burst is transmitted through an optical network optimized for continuous optical streams, the output response signal is characterized by a gain peak followed by gain oscillations for a transient period; this period may be substantial relative to the overall length of the burst. Even with a fast-tracking receiver to receive this response signal, numerous bit-errors arise during the amplitude transient both in the channel carrying the burst as well as other channels. By way of reiteration, this instability occurs because power changes within a single wavelength channel affect the gain for both that wavelength and for other wavelengths through cross-gain saturation in common EDFAs within and between nodes in the optical system.

Cross-saturation effects are especially true if the EDFA is not gain-clamped —such EDFAs are typically used in present-day optical networks. The overall transient response of the optical network due to the bursty input optical signal depends upon the magnitude of the bursty signal, the speed of certain components (e.g., servo-controlled attenuators for stabilizing the EDFAs), the design of the EDFAs, the network topology, and the add/drop characteristics of the network elements, as well as the interactions of the foregoing mechanisms and components.

A recent reference addressing the foregoing issues is a paper entitled "Burst Optical Packet Transport Over the MONET DC Network", by J. Jackel et al., appearing in the European Conference on Optical Components, September 2000, Post-deadline Paper 2.9. The paper presents a technique for "optical burst support" wherein a second independent but closely space optical ballast signal complements the burst signal's average power and allows the bursty signal to pass through the network with minimal error. To accomplish this, a second laser is used to generate optical power complementary to the data so that the total input power remains nearly constant. It is a given that the input signal is in electronic form, and the input signal is monitored to determine when to enable the second laser. However, because of the deployment of the second laser, complicated electronics are required, for example, to ensure the delivery of the nearly constant total input power. The additional complicated electronics, as well as the second laser, add to the expense of the overall system. However, in many applications, electronic versions of the input signal are not accessible or even allowed, so in these applications the electronic solution will not work.

Thus, the prior art is devoid of teachings or suggestions relating to all-optical technique for mitigating transients caused by bursty input signals.

SUMMARY OF THE INVENTION

Shortcomings and limitations of the prior art are obviated, in accordance with the present invention, by a circuitry and concomitant methodology wherein when a bursty input signal is present ("ON" interval), conventional amplification of the bursty input signal is effected; when the bursty signal is not present ("OFF" interval), oscillation is supported via a semiconductor optical amplifier and an optical feedback loop to generate an optical signal to substitute for the missing signal, thereby presenting nearly constant input power on the optical paths in the optical network.

Broadly, in accordance with a one circuit aspect of the present invention, circuitry for generating a burst support signal to augment an input optical burst signal includes: (a) a semiconductor optical amplifier responsive to the input optical burst; and (b) a wavelength-selective optical feedback circuit having an input coupled to the output of the amplifier and an output coupled to the input of the amplifier, wherein the circuitry produces the burst support signal at the output of the amplifier whenever the power level of the input optical burst signal is below a pre-selected threshold.

The broad method aspect of the present invention is commensurate with this broad circuitry aspect.

Broadly, in accordance with another circuit aspect of the present invention, circuitry for generating a burst support signal to augment an input-optical burst signal includes: (a) an optical combiner having the input optical burst signal as one input; (b an semiconductor optical amplifier coupled to the output of the optical combiner; (c) an optical splitter having an input coupled to the output of the optical amplifier, and an output to emit the burst support signal; (d) a tunable optical filter coupled to another output of the optical splitter; (e) an optical isolator coupled to the filter; and (f) an attenuator having an input coupled to optical isolator, and an output coupled to another input of the optical combiner.

Broadly, in accordance with yet another circuit aspect of the present invention, circuitry for generating a burst support signal to augment an input optical burst signal includes: (a) a wavelength selective coupler having the input optical burst signal as one input: (b) a semiconductor optical amplifier coupled to the output of the wavelength selective coupler; (c) an optical splitter having an input coupled to the output of the optical amplifier, and an output to emit the burst support signal; (d) an optical isolator having an input coupled to the another output of the optical splitter; and (e) an attenuator having an input coupled to another output of the of the optical splitter, and an output coupled to another input of the optical combiner.

BRIEF DESCRIPTION OF THE DRAWINGS

The teachings of the present invention can be readily understood by considering the following detailed description in conjunction with the accompanying drawings, in which:

FIGS. 5A and 5B are time plots wherein FIG. 5A repeats FIG. 2A for ease of comparison, and wherein FIG. 5B depicts the response signal at the output of the segment for the burst support circuit of FIG. 3;

To facilitate understanding, identical reference numerals have been used, where possible, to designate identical elements that are common to the figures.

DETAILED DESCRIPTION

To fully appreciate the import of the optical circuitry of the present invention, as well as to gain an appreciation for the underlying operational principles of the present invention, it is instructive to first discuss in overview fashion a segment of the optical network pertinent to the present invention. This overview also serves to introduce terminology so as to facilitate the more detailed description of illustrative embodiments in accordance with the present invention.

Conventional Segment of an Optical Network

Figure 1:
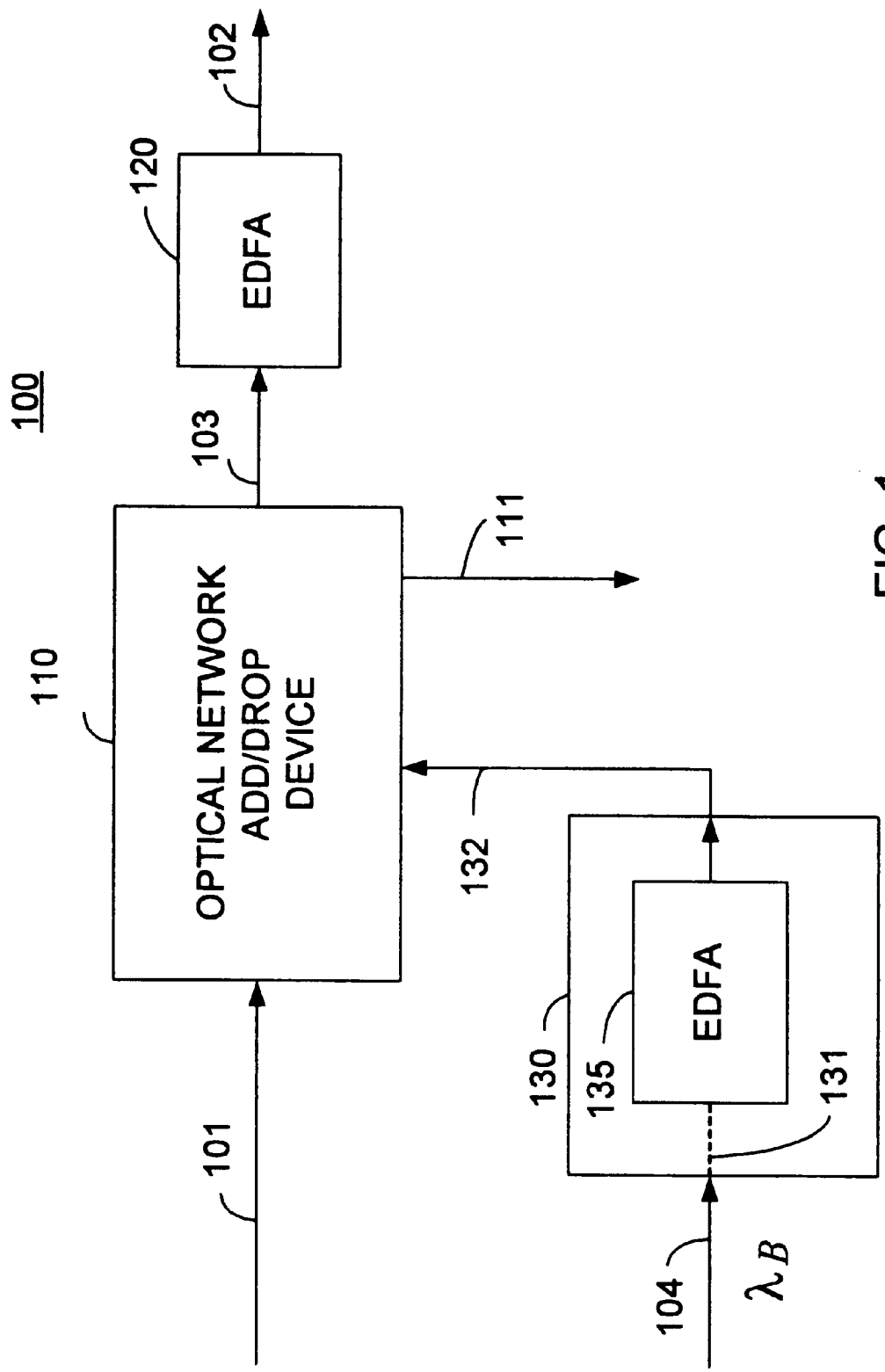
FIG. 1 depicts, in high-level block diagram form, a segment of a conventional optical network, including an input device for adding optical signals to the segment.

With reference to FIG. 1, there is shown segment 100 of an optical network for propagating a plurality of optical signals arriving over optical fiber 101 and departing over optical fiber 102 wherein segment 100 is composed of: (a) optical network add/drop device 110 served by optical fiber 101 wherein optical signals are added to segment 100 via optical input path 133 and are dropped from segment 100 via optical output path 111; (b) EDFA 120 coupled to add/drop device 110 via optical path 103 and outputting optical signals onto fiber 102 at the plurality of wavelengths; and (c) input device 130 for adding an optical signal appearing on optical path 104 to optical segment 100 via add/drop device 110—the input optical signal is presumed to propagate at an optical wavelength $\lambda_B$ for specificity but without loss of generality; optical path 132 couples input device 130 to add/drop device 110. As further depicted, input device 130 quite typically includes EDFA 135 to amplify the input optical signal propagating on optical path 104 to a level commensurate with other signals propagating in segment 100 over fibers 101 and 102. Optical path 131 coupling optical path 104 to EDFA 135 is shown as dashed because, as is typical, the connection may not be direct due to intermediate signal processing which may occur before the optical signal on path 104 arrives at EDFA 135. This other processing is not the subject of the present invention, so there is no need to provide details of such processing. Thus, without loss of generality, the optical signal appearing on path 104 is considered as ultimately serving as the input to EDFA 135 for purposes of the present invention.

Figure 2A:
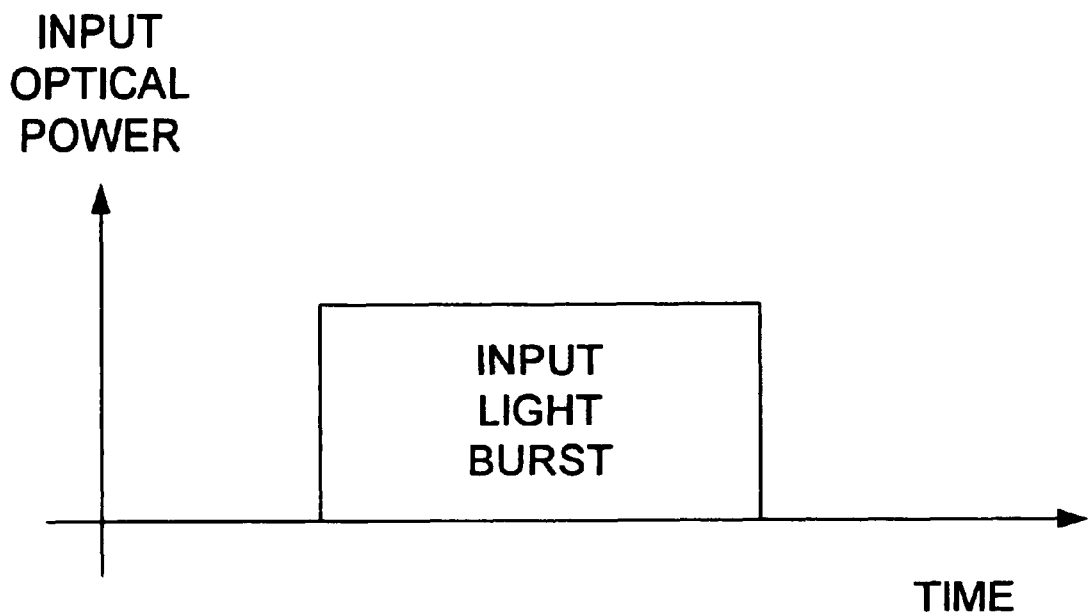
FIGS. 2A and 2B are time plots, respectively, of a bursty input signal and the response signal at the output of the segment.
Figure 2B:
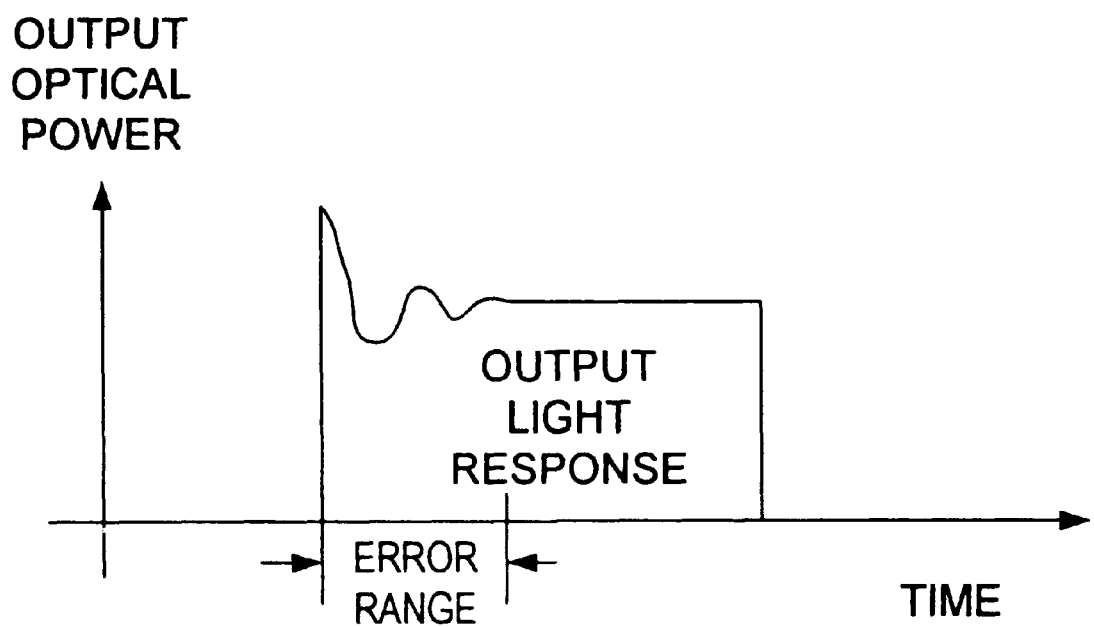

Because of the presence of EDFA's 120 and 135, as highlighted in the Background Section, it is known that if the input optical signal appearing on fiber 104 is a burst signal, then a transient period is exhibited until the optical signals conveyed on output fiber 102 stabilize. During this transient period, errors are generated in the optical signals on fiber 102. To demonstrate this phenomenon qualitatively, reference is made to FIGS. 2A and 2B. FIG. 2A is a plot of input optical power versus time for a single burst of optical light appearing on fiber 104 at the presumed wavelength $\lambda_B$ FIG. 2B is a plot of output optical power that appears, for example, on optical fiber 102 at wavelength $\lambda_B$ for the input burst of FIG. 2A. The gain peak-gain oscillation nature of the response is evident; the "error range" is highlighted in the plot.

Segment of the Optical Network In Accordance With the Present Invention

Figure 3:
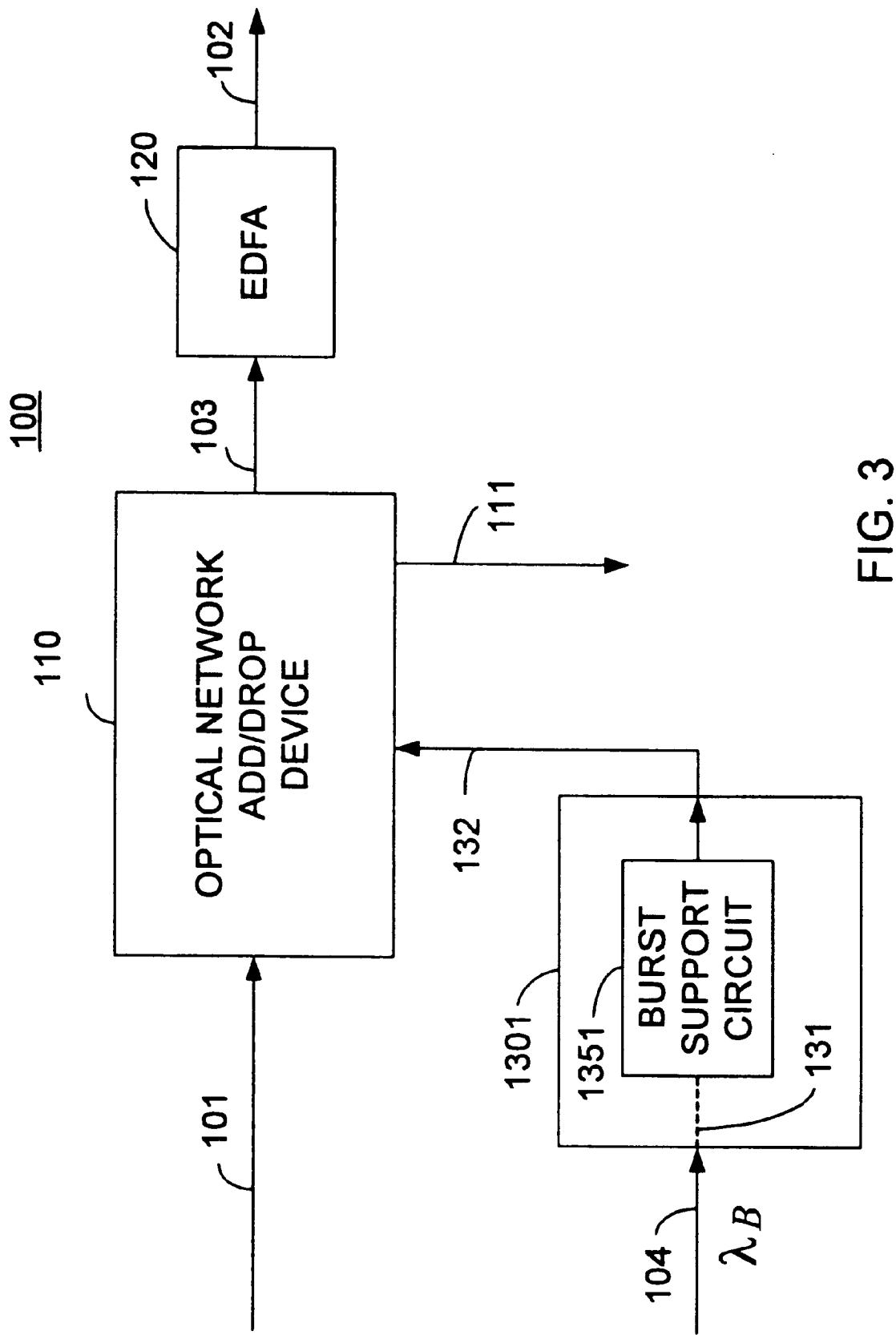
FIG. 3 depicts, in high-level block diagram form, the segment of FIG. 1 wherein the input device now includes a burst support circuit in accordance with the present invention for adding optical signals to the segment.

Now with reference to FIG. 3, in accordance with the present invention, burst support circuit 1351 replaces EDFA 135 in input device 1301. Burst support circuit 1351 functions generally as follows: when a signal of wavelength $\lambda_B$ is present on fiber 104, that is, there is input power present ("ON mode" of the bursty input signal), circuit 1351 amplifies the signal to the level required for delivery to add/drop device 110; however, when no signal is present at wavelength $\lambda_B$ ("OFF mode"), circuit 1351 supplies optical power that substitutes for the missing signal, at a wavelength (designated $\lambda_{BS}$) "close to" wavelength $\lambda_B$, thereby presenting segment 100 with nearly constant input power.

To consider the meaning of $\lambda_{BS}$ being "close to" $\lambda_B$, it is helpful to conceptualize the overall network, and segment 100 in particular, as propagating the plurality of optical signals over a plurality of channels wherein each channel propagates a corresponding one of the optical signals. One may further characterize each channel as a "passband" centered on one of the wavelengths; as such, each passband has a conceptual low cutoff wavelength of, say $\lambda_L$, and a conceptual high cutoff wavelength of, say $\lambda_H$. Thus, to ensure that the overall optical network operates as if the bursty signal is present at all times to thereby mitigate errors due to the bursty signal, circuit 1351 is arranged to supply a burst support optical signal that falls within the passband. Accordingly, $\lambda_{BS}$ is the range $(\lambda_L, \lambda_H)$, but with $\lambda_{BS} \neq \lambda_B$. As an example, $\lambda_B = \lambda_{BS} + 0.5$ nm. It is therefore readily appreciated that the acceptable distance between the bursty signal and the burst support signal is determined by the channel width.

A First Illustrative Embodiment

Figure 4:
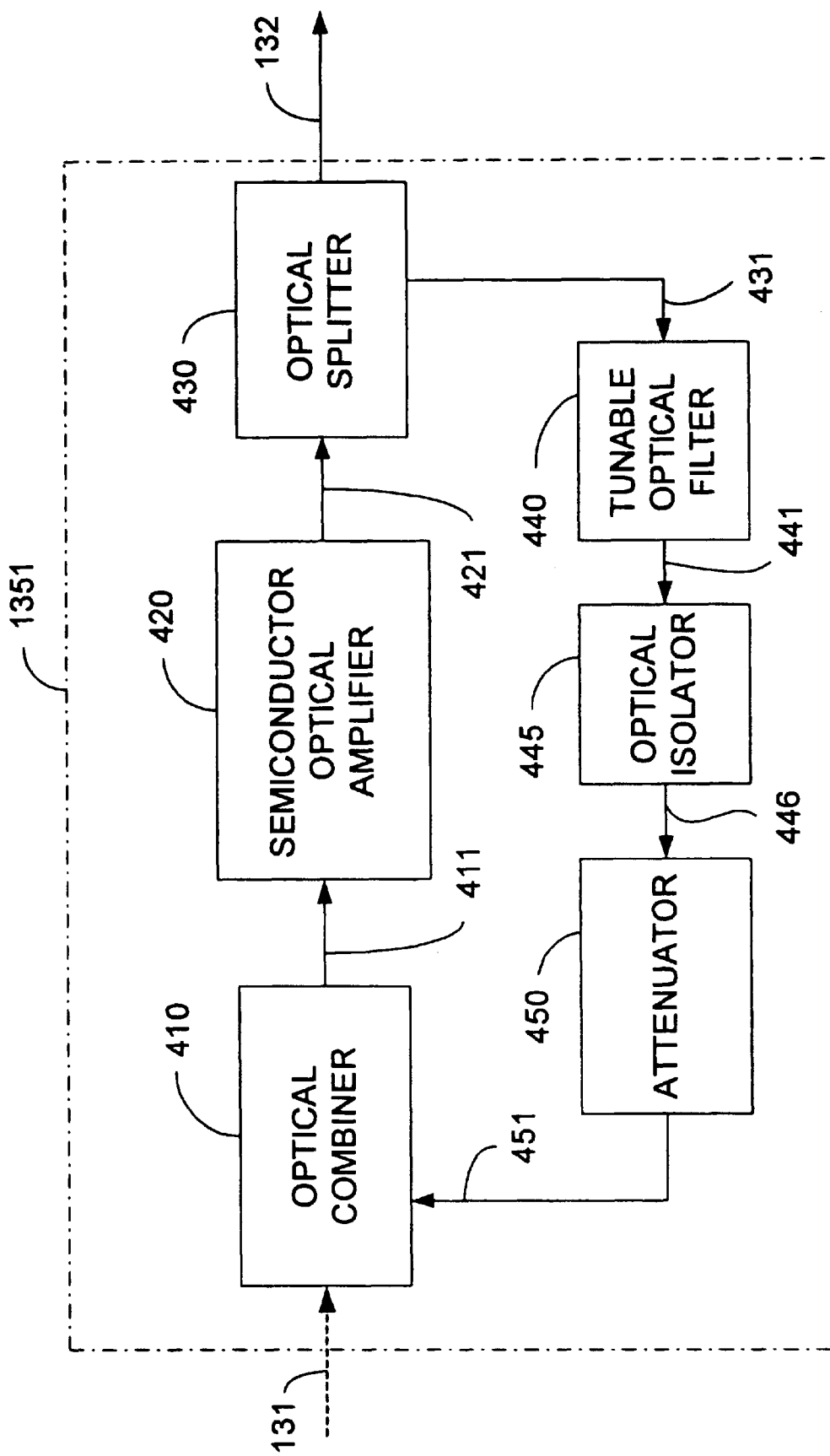
FIG. 4 is illustrative of one embodiment of the burst support circuit of FIG. 3.

With reference to FIG. 4, there is shown one illustrative embodiment of burst support circuit 1351 of FIG. 3. This embodiments includes: (a) optical combiner 410 for combining the input optical signal appearing on optical path 131 with the optical signal appearing on path 451; (b) semiconductor optical amplifier (SOA) 420 coupled to the output of combiner 410 via optical path 411; (c) optical splitter 430, coupled to the output of SOA 420 via optical path 421, and providing two outputs, namely, the optical signals on optical paths 132 and 431; (d) tunable optical filter 440 coupled to optical path 431; (e) optical isolator 445, coupled to filter 440 via optical path 441, for ensuring that the burst support signal exits circuit 1351 in the same direction as the input optical signal 132; and (f) attenuator 450, coupled to isolator 445 via optical path 446, for producing the optical signal on optical path 451. An exemplary semiconductor optical amplifier is Model No. A1901SOA available from Alcatel; an exemplary tunable filter is Model No. OTF-655 available from Santec. The combiner, splitter, and attenuator are well-known conventional components.

The operation of circuit 1351 is as follows. When the gain of SOA 420 is less than the loss through filter 440 and attenuator 450, there is no lasing by SOA 420. This mode of operation occurs whenever a so-called saturating signal is present on path 131 because the gain of SOA 420 is low in the presence of a saturating signal (the gain characteristic of SOA 420 will be discussed in more detail shortly with reference to FIG. 6). A saturating signal can be achieved, for example, by the power in the ON cycle of a bursty input optical signal. However, when no optical power is present on path 131 (for example, during the OFF cycle of a bursty optical signal), then lasing occurs in SOA 420 at a wavelength determined by filter 440. This lasing power at the pre-selected wavelength (e.g., $\lambda_{BS}$) is coupled to combiner 410, through SOA 420 to splitter 430 and, in turn, onto output optical path 132. In effect, the cascade of SOA 420, splitter 430, filter 440, isolator 445, attenuator 450, and combiner 410 forms an optical feedback loop which supports oscillation at the wavelength set by filter 440. In addition, attenuator 450 defines the minimum gain required in SOA 420 if it is to function as a laser.

Accordingly, burst support circuit 1351 operates to either provide, on path 132, an amplified version of the signal appearing on path 131 or a substitute signal at a pre-selected wavelength in place of the signal on path 131.

Figure 5A:
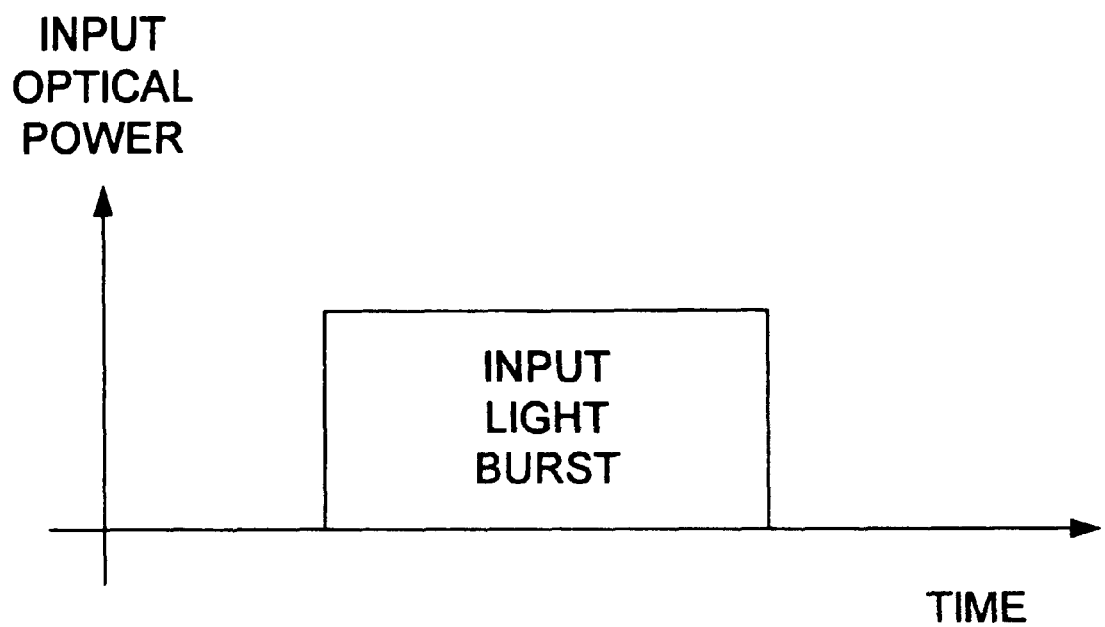
Figure 5B:
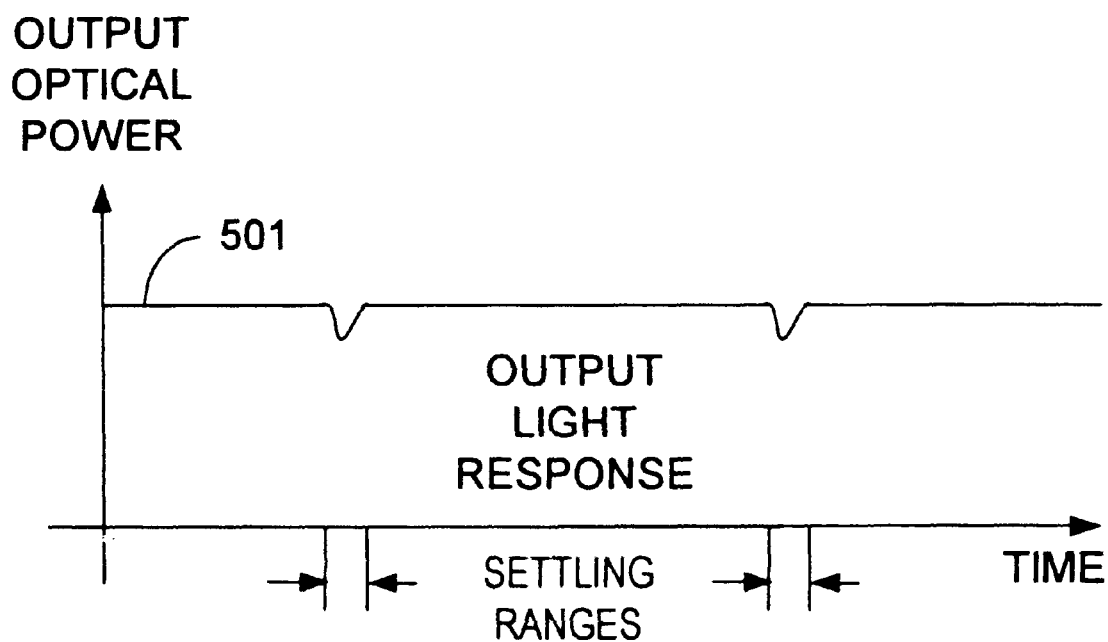

To demonstrate the improvement in performance of burst support circuit 1351 over the conventional arrangement of EDFA 135, reference is now made to FIG. 5. In particular, FIG. 5A repeats FIG. 2A for ease of comparison to FIG. 5B which qualitatively depicts the output optical power on path 132. Prior to the ON cycle of the input light burst of FIG. 5A, FIG. 5B depicts that optical output power 501 is already present because the burst support signal is active. When the input light burst is turned ON, there is a short settling time that occurs because SOA 420 is driven from an operating region of high gain to a region of lower gain. Now, the burst support signal is extinguished because there is not sufficient gain by the SOA to support optical feedback oscillations. On the other hand, the bursty optical signal now provides power to output fiber 132. The fall-off of the burst support signal in the presence of a bursty input signal causes a barely discernible effect on the overall power. The settling time and extent of the transition is exaggerated in FIG. 5B; in operation, virtually no errors are detectable in the output optical stream 132 representative of the bursty input optical signal.

Figure 6:
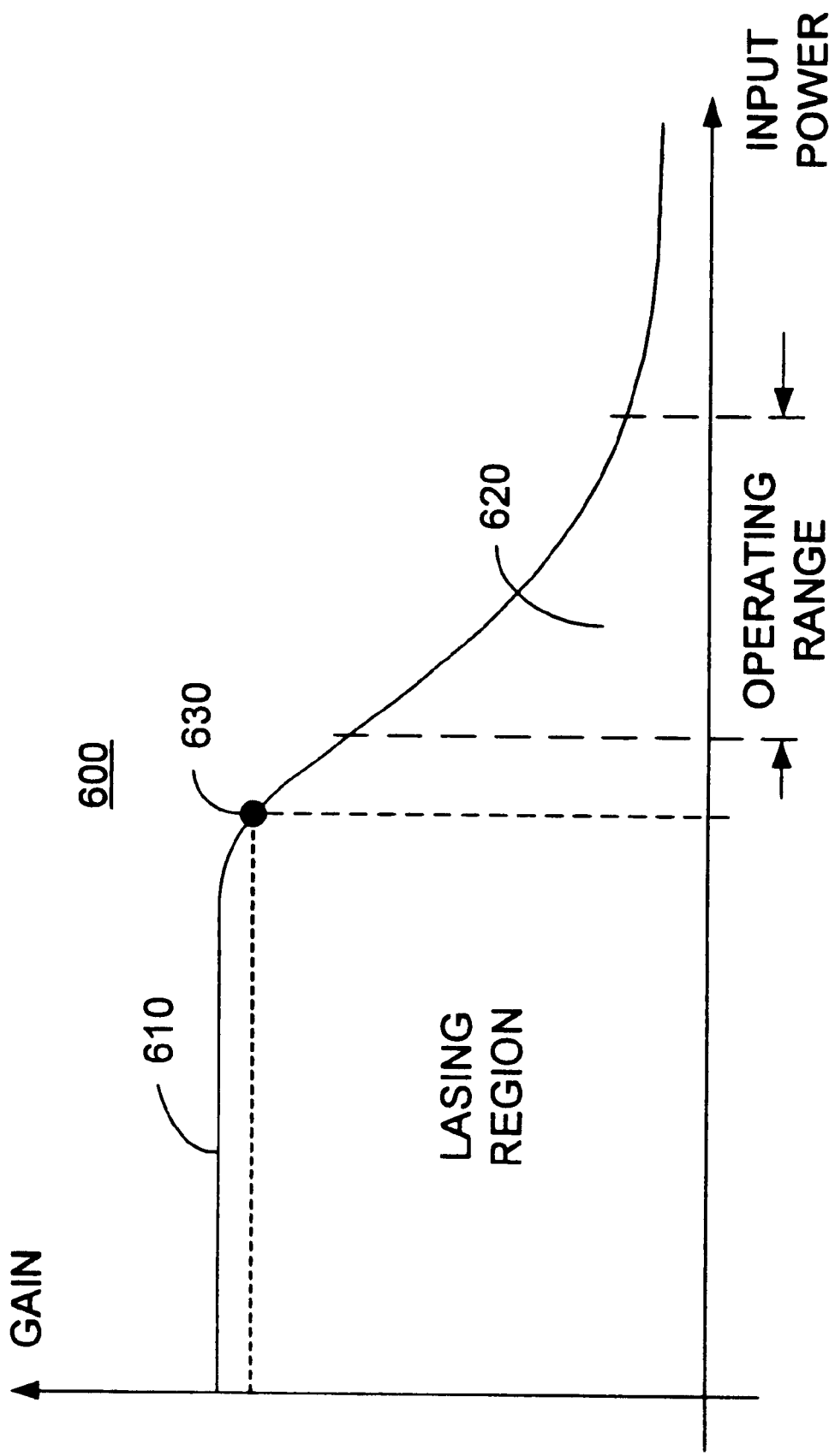
FIG. 6 depicts the gain characteristic of the semiconductor optical amplifier (SOA) of FIG. 4 illustrating the equilibrium point for operation of an optical feedback loop encompassing the SOA.

With reference to FIG. 6, there is shown the standard characteristic 610 of gain versus input power for SOA 420. With optical power present in the signal on path 131, the normal "operating range" is shown, and referred to by reference numeral 620. In this region, SOA 420 exhibits less gain than for input signals of lower power. When input power is reduced from the power required to hold SOA in region 620, the gain traverses the characteristic along the gain line; ultimately, the gain is flat (region 610) for low values of input power, that is, is independent of input power. If it is assumed that SOA 420 initially operates in region 620 during the ON cycle of bursty input signal, and then the OFF cycle occurs. As the gain traverses the gain curve going from low-to-higher gain, at some gain point, say point 630, equilibrium is reached wherein that the loss of filter 440 and attenuator 450 is essentially equal to the gain of SOA 420. At this point, lasing by SOA 420 occurs, giving rise to the burst support signal. As the burst support signal builds up through the optical feedback loop, the input power increases, tending to reduce the gain and move the operating point of SOA 420 towards the "operating range". But then the gain decreases, so once again burst support occurs. Thus, it is clear that gain point 630 becomes the equilibrium point for sustainable oscillations. Attenuator 650 is set so that an equilibrium point such as point 630 is possible. For instance, if the loss of attenuator 650 is higher than the gain referenced by numeral 610, the burst support signal never manifests itself. On the other hand, the loss of attenuator 650 should not be too low so that oscillations occur within the "operating range". In effect, attenuator 650 is set so that oscillations occur whenever the input power from the bursty input signal is below a predetermined threshold.

A Second Illustrative Embodiment

Figure 7:
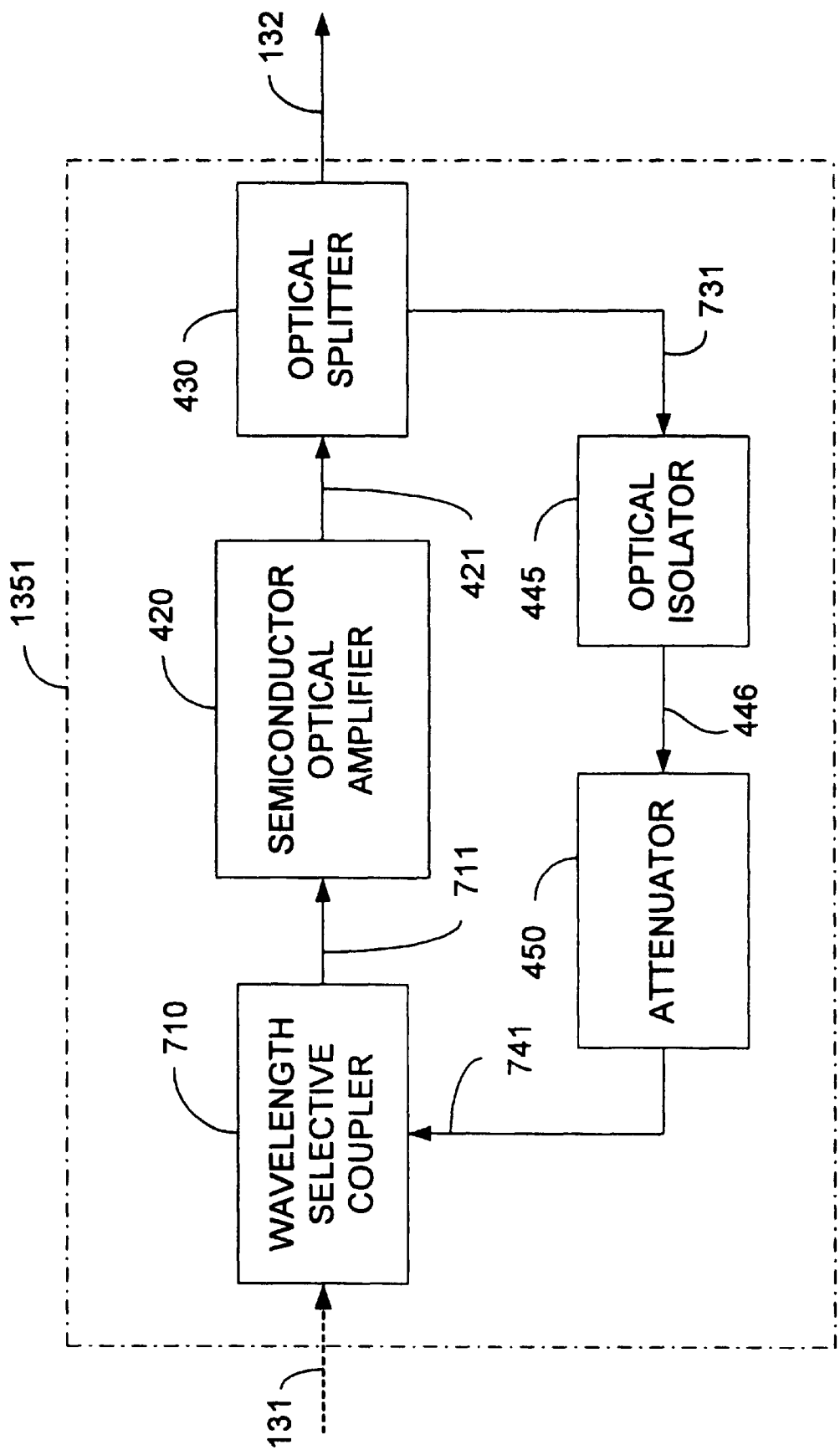
FIG. 7 is illustrative on another embodiment of the burst support circuit of FIG. 3.

With reference to FIG. 7, there is shown another illustrative embodiment of burst support circuit 1351 of FIG. 3. This embodiments includes: (a) wavelength selective coupler 710 for combining the input optical signal appearing on optical path 131 with the optical signal appearing on path 741; (b) semiconductor optical amplifier (SOA) 420 coupled to the output of combiner 710 via optical path 711; (c) optical splitter 430, coupled to the output of SOA 420 via optical path 421, and providing two outputs, namely, the optical signals on optical paths 132 and 731; (d) optical isolator 445, coupled to splitter 430 via optical path 731, for ensuring that the burst support signal exits circuit 1351 in the same direction as the input optical signal 132; and (e) attenuator 450, coupled to isolator via path 446, for producing the optical signal on optical path 741. Wavelength selective coupler 710 is a commercially available device wherein: (a) all the wavelengths arriving on optical path 131 are coupled to output optical path 711; and (b) only a pre-selected one of the optical signals arriving on optical path 741 is coupled through to output optical path 711. For example, in the preferred embodiment, only $\lambda_{BS}$ is coupled from path 741 to path 711. An exemplary wavelength selective coupler is Model No. 25150 Add/Drop Module available from JDS Uniphase.

The operation of circuit 1351 in FIG. 7 is as follows. When the gain of SOA 420 is less than the loss of attenuator 450, there is no lasing by SOA 420. Recall this mode of operation occurs whenever a saturating signal is present on path 131 because the gain of SOA 420 is low in the presence of a saturating signal. A saturating signal is produced, for example, by the power in the ON cycle of a bursty input optical signal. However, when no optical power is present on path 131 (for example, during the OFF cycle of a bursty optical signal), then lasing occurs in SOA 420 at a wavelength determined by wavelength selective coupler 710. This lasing power at the pre-selected wavelength is coupled from coupler 710, through SOA 420 to splitter 430 and, in turn, onto output optical path 132. In effect, the cascade of SOA 420, splitter 430, isolator 445, attenuator 450, and coupler 410 forms an optical feedback loop which supports oscillation at the wavelength set by filter 440. In addition, attenuator 450 defines the minimum gain required in SOA 420 if it is to function as a laser.

Accordingly, burst support circuit 1351 of FIG. 7 operates to either provide, on path 132, an amplified version of the signal appearing on path 131 or a substitute signal at a pre-selected wavelength in place of the signal on path 131.

A Generic Illustrative Embodiment

Figure 8:
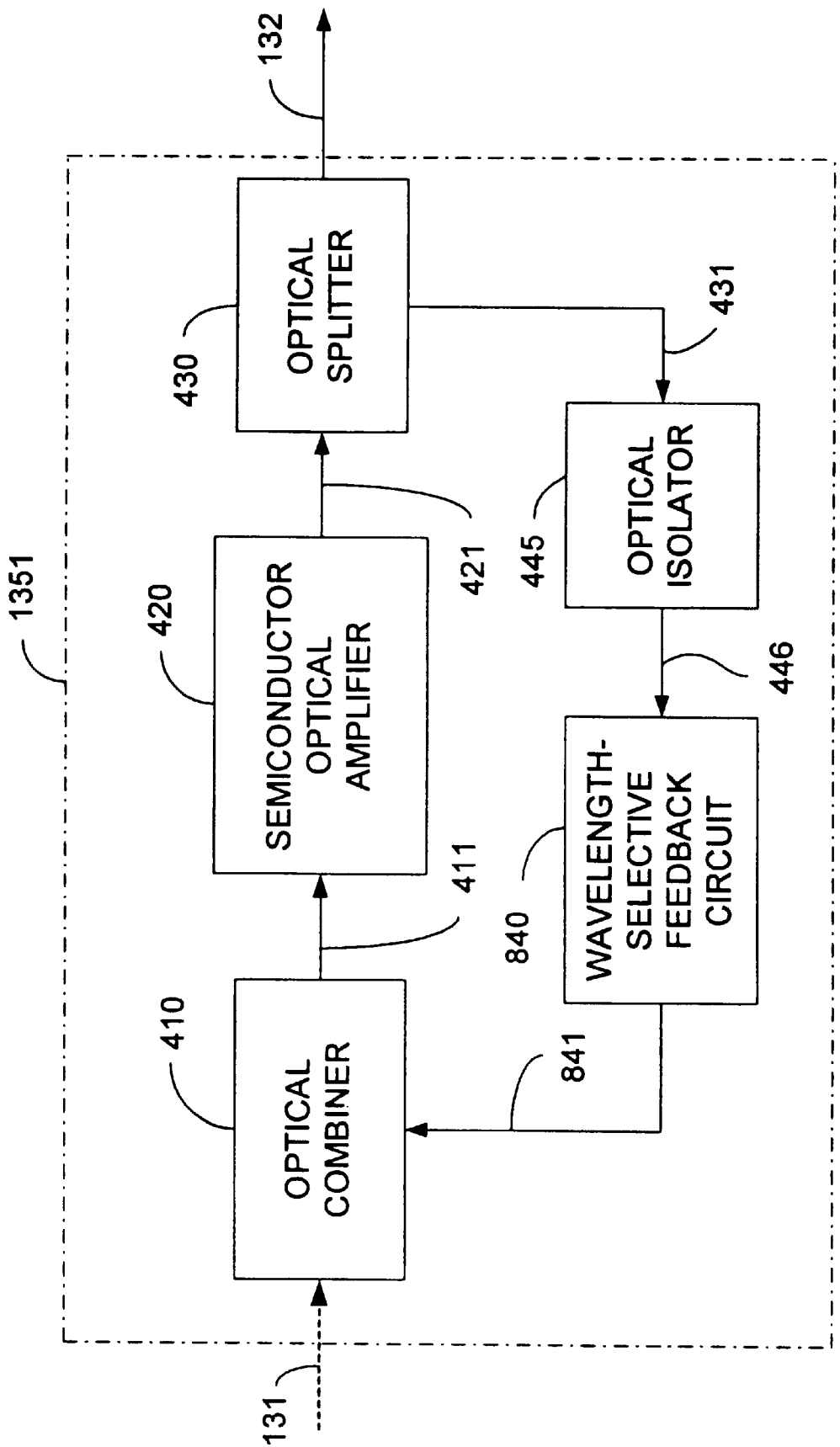
FIG. 8 illustrates the generic form of the burst support circuit of FIG. 3.

In view of the two illustrative embodiments above, it is possible to generalize the teachings of the two embodiments to arrive at the high-level block diagram of FIG. 8. Burst support circuit 1351 of FIG. 8 is composed of: (a) optical combiner 410 for combining the input optical signal appearing on optical path 131 with the optical signal appearing on path 841; (b) semiconductor optical amplifier (SOA) 420 coupled to the output of combiner 410 via optical path 411; (c) optical splitter 430, coupled to the output of SOA 420 via optical path 421, and providing two outputs, namely, the optical signals on optical paths 132 and 431; (d) optical isolator 445, coupled to splitter 430 via optical path 431, for ensuring that the burst support signal exits circuit 1351 in the same direction as the input optical signal 132; and (e) wavelength-selective optical feedback circuit 840, having path 446 as an input from isolator 445, for producing the optical signal on optical path 841.

The operation of circuit 1351 of FIG. 8 is as follows. When the gain of SOA 420 is less than the loss through circuit 840, there is no lasing by SOA 420. This mode of operation occurs whenever a saturating signal is present on path 131 because the gain of SOA 420 is low in the presence of a saturating signal. A saturating signal occurs, for example, by the power in the ON cycle of a bursty input optical signal. However, when no optical power is present on path 131 (for example, during the OFF cycle of a bursty optical signal), then lasing occurs in SOA 420 at a wavelength determined by circuit 840. This lasing power at the pre-selected wavelength (e.g., $\lambda_{BS}$) is coupled to combiner 410, through SOA 420 to splitter 430 and, in turn, onto output optical path 132. In effect, the cascade of SOA 420, splitter 430, isolator 445, feedback circuit 840, and combiner 410 forms an optical feedback loop which supports oscillation at the wavelength set by circuit 840. In addition, circuit 840 defines the minimum gain required in SOA 420 if it is to function as a laser.

Accordingly, burst support circuit 1351 operates to either provide, on path 132, an amplified version of the signal appearing on path 131 or a substitute signal at a pre-selected wavelength in place of the signal on path 131.

Flow Diagram

Figure 9:
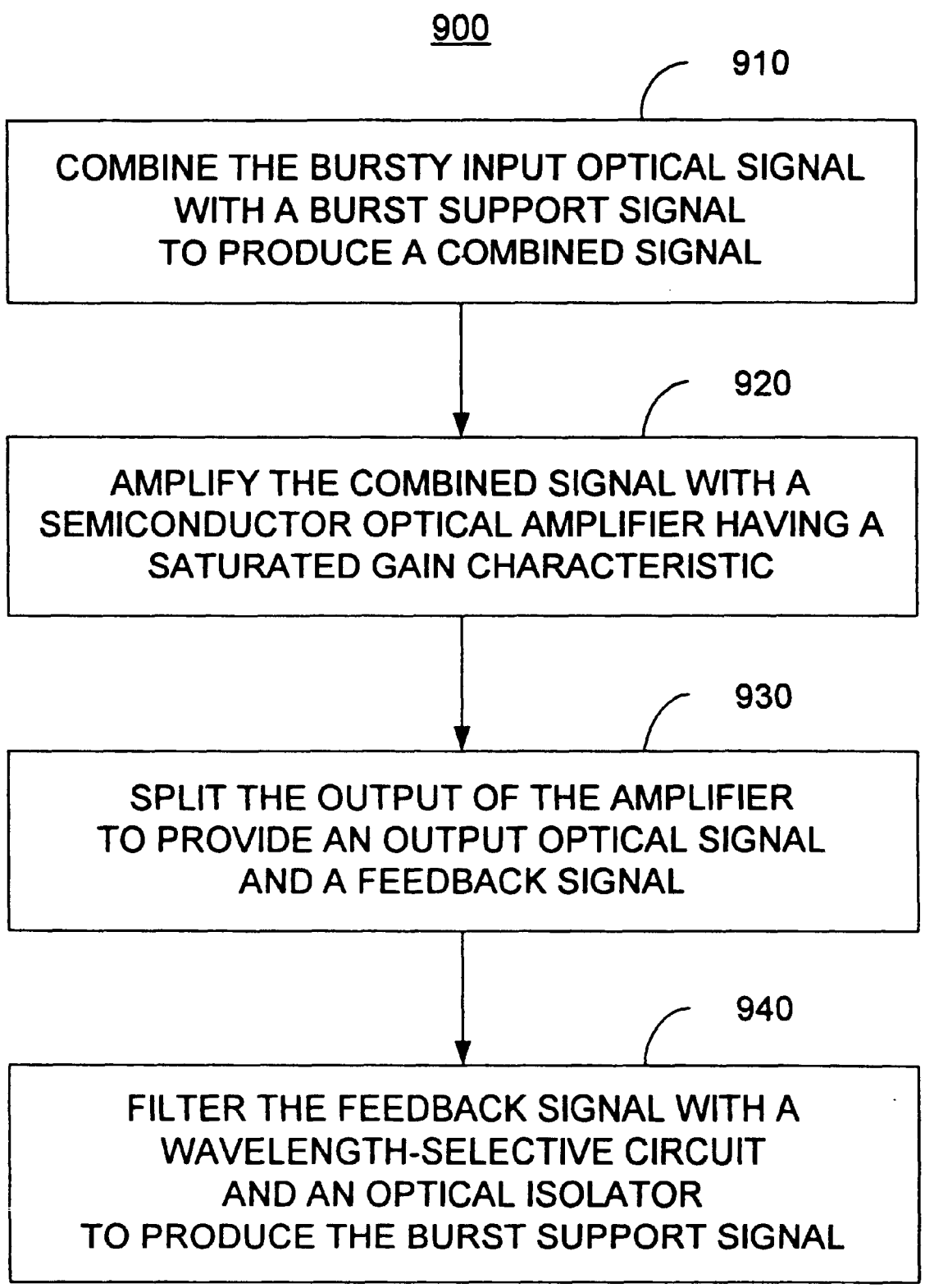
FIG. 9 is a flow diagram for the circuitry of FIG. 8.

Flow diagram 900 of FIG. 9 depicts the steps carried out by burst support circuit 1351, in any of its various embodiments, to generate the burst support signal at the desired wavelength (e.g., $\lambda_{BS}$) With reference to FIG. 9, processing block 910 depicts the step of combining the bursty input optical signal with the burst support signal to produce a combined signal, although both are not present at the same time. Next, as represented by processing block 920, the step of amplifying the combined signal with a semiconductor optical amplifier having a saturated gain characteristic is invoked. Then, as shown by processing block 930, the step of splitting the output of the amplifier to provide the output optical signal and an optical feedback signal is executed. Finally, the last step of filtering the feedback signal with a wavelength-selective circuit and optical isolator to produce the burst support signal is invoked, as evidenced by processing block 940.

Closing

Although the present invention have been shown and described in detail herein, those skilled in the art can readily devise many other varied embodiments that still incorporate these teachings. Thus, the previous description merely illustrates the principles of the invention. It will thus be appreciated that those with ordinary skill in the art will be able to devise various arrangements which, although not explicitly described or shown herein, embody principles of the invention and are included within its spirit and scope. Furthermore, all examples and conditional language recited herein are principally intended expressly to be only for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, that is, any elements developed that perform the function, regardless of structure.

In addition, it will be appreciated by those with ordinary skill in the art that the block diagrams herein represent conceptual views of illustrative circuitry embodying the principles of the invention. Similarly, it will be appreciated that any flow charts, flow diagrams, and the like represent various processes which may be substantially represented in computer readable medium and so executed by a computer or processor, whether or not such computer or processor is explicitly shown.

In the claims herein any element expressed as a means for performing a specified function in intended to encompass any way of performing that function including, for example, a combination of circuit elements which performs that function. The invention as defined by such claims resides in the fact that the functionalities provided by the various recited means are combined and brought together in the manner called for in the claims. Applicant thus regards and means which can provide those functionalities as equivalent to those shown herein.

Thus, although various embodiments which incorporate the teachings of the present invention have been shown and described in detail herein, those skilled in the art can readily devise many other varied embodiments that still incorporate these teachings.

What is claimed is:

1. Circuitry for generating a burst support signal to augment an input optical burst signal, the circuitry comprising a semiconductor optical amplifier responsive to the input optical burst, and a wavelength-selective optical feedback circuit having an input coupled to the output of the amplifier and an output coupled to the input of the amplifier, the circuitry producing the burst support signal at the output of the amplifier whenever the power level of the input optical burst signal is below a preselected threshold.

2. The circuitry as recited in claim 1 wherein the feedback circuit includes a tunable optical filter.

3. The circuitry as recited in claim 2 wherein the tunable optical filter is tuned to a pre-determined optical wavelength.

4. The circuitry as recited in claim 1 wherein the feedback circuit includes a series arrangement of a tunable optical filter, an optical isolator, and an attenuator.

5. The circuitry as recited in claim 4 wherein the input burst optical signal is carried by a given optical wavelength and the tunable optical filter is tuned to a predetermined optical wavelength with reference to the given optical wavelength.

6. The circuitry as recited in claim 4 wherein the attenuator is set to generate the burst support signal whenever the input optical burst signal falls below a preselected power threshold.

7. The circuitry as recited in claim 4 wherein the attenuator is set so that the loop composed of the amplifier, the tunable optical filter, the optical isolator, and the attenuator oscillates whenever the input optical burst signal falls below a pre-selected power threshold.

8. The circuitry as recited in claim 1 wherein the semiconductor optical amplifier lases whenever the input optical burst signal falls below a pre-selected power threshold and amplifies whenever the input optical burst signal exceeds a preselected power threshold.

9. Circuitry for generating a burst support signal to augment an input optical burst signal to produce an output optical signal, the circuitry comprising
   an optical combiner having the input optical burst signal as one input,
   a semiconductor optical amplifier coupled to the output of the optical combiner,
   an optical splitter having: an input coupled to the output of the optical amplifier; and an output to emit the burst support signal when the burst support signal is present and output the amplified optical signal when the burst support signal is not present,
   a tunable optical filter coupled to another output of the optical splitter,
   an optical isolator coupled to the tunable filter, and
   an attenuator having: an input coupled to optical isolator; and a burst output coupled to another input of the optical combiner.

10. The circuitry as recited in claim 9 wherein the tunable optical filter is tuned to a pre-determined optical wavelength.

11. The circuitry as recited in claim 9 wherein the input burst optical signal is carried by a given optical wavelength and the tunable optical filter is tuned to a predetermined optical wavelength with reference to the given optical wavelength.

12. The circuitry as recited in claim 9 wherein the attenuator is set to generate the burst support signal whenever the input optical burst signal falls below a preselected power threshold.

13. The circuitry as recited in claim 9 wherein the attenuator is set so that the loop composed of the combiner, the optical amplifier, the splitter, the tunable optical filter, the optical isolator, and the attenuator oscillates whenever the input optical burst signal falls below a pre-selected power threshold.

14. The circuitry as recited in claim 9 wherein the semiconductor optical amplifier lases whenever the input optical burst signal falls below a pre-selected power threshold and amplifies whenever the input optical burst signal exceeds a preselected power threshold.

15. Circuitry for generating a burst support signal to augment an input optical burst signal to produce an output optical signal, the circuitry comprising
   a wavelength selective coupler having the input optical burst signal as one input,
   a semiconductor optical amplifier coupled to the output of the wavelength selective coupler,
   an optical splitter having: an input coupled to the output of the optical amplifier; and an output to emit the burst support signal when he burst support signal is present and output the amplified optical signal when the burst support signal is not present,
   an optical isolator having an input coupled to another output of the optical splitter, and
   an attenuator having: an input coupled to the optical isolator; and an output coupled to another input of the optical combiner.

16. The circuitry as recited in claim 15 wherein the wavelength selective coupler selects a pre-determined optical wavelength delivered by the attenuator.

17. The circuitry as recited in claim 15 wherein-the input burst optical signal is carried by a given optical wavelength and the wavelength selective coupler selects a pre-determined optical wavelength with reference to the given optical wavelength.

18. The circuitry as recited in claim 15 wherein the attenuator is set to generate the burst support signal whenever the input optical burst signal falls below a pre-selected power threshold.

19. The circuitry as recited in claim 15 wherein the attenuator is set so that the loop composed of the wavelength selective coupler, the optical amplifier, the splitter, the optical isolator, and the attenuator oscillates whenever the input optical burst signal falls below a pre-selected power threshold.

20. The circuitry as recited in claim 15 wherein the semiconductor optical amplifier lases whenever the input optical burst signal falls below a pre-selected power threshold and amplifies whenever the input optical burst signal exceeds a preselected power threshold.

21. A method for generating a burst support signal to produce an output optical signal in response to a bursty input optical signal, the method comprising the steps of
   combining the bursty input optical signal with the burst support signal to produce a combined signal,
   amplifying the combined signal with a semiconductor optical amplifier having a saturated gain characteristic,
   splitting the output of the amplifier to provide the output optical signal and an optical feedback signal, and
   filtering the feedback signal with a wavelength-selective circuit and an optical isolator to produce the burst support signal.

22. The method as recited in claim 21 wherein the step of filtering includes the step of attenuating the feedback signal.

23. The method as recited in claim 21 wherein the step of filtering includes the step of tuning the wavelength selective-circuit to a pre-determined optical wavelength.

* * * * *

UNITED STATES PATENT AND TRADEMARK OFFICE
CERTIFICATE OF CORRECTION

PATENT NO.    : 6,515,796 B2
DATED         : February 4, 2003
INVENTOR(S)   : Janet Jackel It is certified that error appears in the above-identified patent and that said Letters Patent is hereby corrected as shown below:

Column 9,
Line 48, change "a burst output" to -- an output --.

Column 10,
Line 16, change "he" to -- the --.
Line 28, change "wherein-the" to -- wherein the --.
Line 47, change "preselected" to -- pre-selected --.

Signed and Sealed this

Eighteenth Day of October, 2005

JON W. DUDAS
*Director of the United States Patent and Trademark Office*